United States Patent [19]
Takasaki et al.

[11] Patent Number: 5,312,783
[45] Date of Patent: May 17, 1994

[54] PROCESS FOR THE PREPARATION OF A HIGH DIELECTRIC THIN FILM USING ECR PLASMA CVD

[75] Inventors: Kanetake Takasaki; Satoshi Nakai, both of Kawasaki, Japan

[73] Assignee: Fujitsu Limited, Kawasaki, Japan

[21] Appl. No.: 891,154

[22] Filed: May 28, 1992

[30] Foreign Application Priority Data

May 28, 1991 [JP] Japan .................................. 3-121529

[51] Int. Cl.⁵ .................... H01L 21/00; H01L 21/02; H01L 21/302; H01L 21/463
[52] U.S. Cl. .................................. 437/235; 437/225; 437/228; 437/243
[58] Field of Search ................ 437/225, 228, 235, 243

[56] References Cited
U.S. PATENT DOCUMENTS 4,492,620 1/1985 Matsuo et al. ................. 204/192.23

Primary Examiner—Brian E. Hearn
Assistant Examiner—B. Everhart
Attorney, Agent, or Firm—Staas & Halsey

[57] ABSTRACT

A process for the preparation of a high dielectric thin film. A tantalum oxide film is formed on a substrate at a temperature of from 400° to 850° C. by means of an electron cyclotron resonance plasma chemical vapor deposition (ECR plasma CVD) method. A high dielectric film having little leakage current, good surface flatness and good step coverage is obtained.

3 Claims, 5 Drawing Sheets

PROCESS FOR THE PREPARATION OF A HIGH DIELECTRIC THIN FILM USING ECR PLASMA CVD

BACKGROUND OF THE INVENTION

1. Field of the invention

The present invention relates to a process for the preparation of a high dielectric thin film. More particularly, the present invention relates to a process for the preparation of a high dielectric thin film used to increase the capacitance of a condenser (i.e., a capacitor) in a semiconductor device.

2. Description of the Related Art

Remarkable progress has been made in the technologies required for accomplishing miniaturization of a semiconductor element having a high capacitance, high operation speed and high integration density and, accordingly, the development of a high dielectric thin film is now necessary.

Conventionally a sputtering method, a metal organic chemical vapor deposition (MOCVD) method, and a plasma chemical vapor deposition method are used as a means of preparing a tantalum oxide ($Ta_2O_5$) film as the dielectric thin film of a condenser in a semiconductor element, but the characteristics of the $Ta_2O_5$ film obtained by using these methods do not satisfy the necessary requirements.

Namely, a film obtained by the plasma CVD method has many oxygen vacancies therein, and these oxygen vacancies cause an occurrence of a leakage current. Also, the surface flatness of a film obtained by the MOCVD method is poor, in addition to the problem the oxygen vacancies. Furthermore, reproduction of the composition of the thin film obtained by sputtering is poor, due to a deterioration of the target, and further, the step coverage is poor.

To obtain a tantalum oxide thin film having good properties and able to be used for a capacitor in a memory cell, the following conditions must be satisfied: (1) good controllability of the composition of the film, (2) good fineness of the film, (3) good step coverage, and (4) good surface flatness of the film.

Accordingly, an attempt was made to employ an electron cyclotron resonance (ECR) plasma chemical vapor deposition (CVD) method.

This method, however, is usually employed at a low temperature, i.e., a temperature of lower than 300° C., and this is why the ECR plasma CVD method is usually employed for depositing SiN, or SiO on aluminum.

The present inventors found that the tantalum oxide thin film obtained by the ECR plasma CVD method at a low temperature does not satisfy the four requirements mentioned above.

Therefore, the present inventors made various, diverse attempts to obtain a tantalum oxide thin film satisfying the above requirements, and surprisingly found that a tantalum oxide thin film satisfying the above requirements ca be obtained by the ECR plasma CVD method within a certain high temperature range, i.e., at a temperature of from 400° to 850° C.

SUMMARY OF THE INVENTION

In view of the problems of the prior art described above, an object of the present invention is to provide a process for the preparation of a high dielectric thin film having no oxygen vacancies, a good step coverage and a good surface flatness, and to provide a process for the preparation of the high dielectric thin film, in which no damage will occur to the properties of the device, formed at a previous step when forming the dielectric thin film thereon.

The object of the present invention can be accomplished by a process, for the preparation of a high dielectric thin film, which comprises forming a tantalum oxide film on a substrate at a temperature of about 400° to 850° C. by an ECR plasma CVD method.

Furthermore, another object of the present invention is to provide a process for the preparation of a memory cell consisting of one capacitor and one transistor, in which the one capacitor is formed by:

(a) forming a lower electrode on a substrate;

(b) forming a tantalum oxide film on a lower electrode at a temperature of about 400° to 850° C. by an ECR plasma CVD method; and (c) forming an upper electrode on the tantalum oxide film.

BRIEF DESCRIPTION OF THE DRAWINGS

The objects and advantages of the present invention will become more apparent from the following description of a preferred embodiment, taken in connection with the accompanying drawings, in which.

DESCRIPTION OF THE PREFERRED EMBODIMENT

Figure 1:
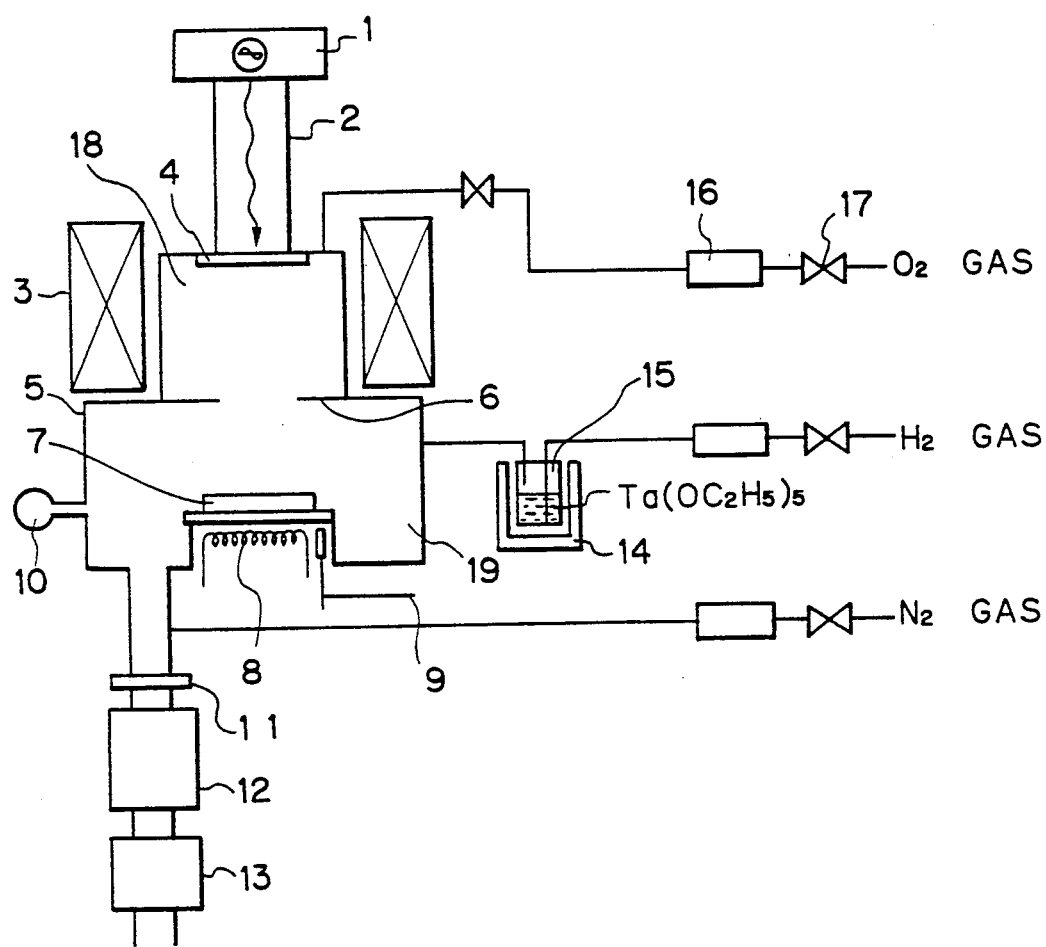
FIG. 1 is an explanatory view showing the construction of an ECR plasma CVD apparatus used for carrying out one example of the present invention.

FIG. 1 is an explanatory view showing the construction of the ECR plasma CVD apparatus used for carrying out the present invention.

In the drawing, reference number 1 denotes a microwave generating tube; 2 is a waveguide; 3 is a magnet; 4 is a window; 5 is a housing; 6 is an aperture; 7 is a substrate; 8 is a heater; 9 is a thermocouple; 10 is a pressure gauge; 11 is a gate valve; 12 is a turbo-molecular pump; 13 is a mechanical booster pump; 14 is a thermostat; 15 is a bubbler; 17 is a valve; 18 is a plasma generating chamber; and 19 is a reaction chamber.

In the present invention, using this ECR plasma CVD apparatus, when the substrate is heated to a temperature between 400° C. and 850° C., a tantalum oxide thin film having no oxygen vacancies, a good step coverage and a good surface flatness can be formed, without lowering the specific property of the substrate.

In the preferred embodiment, ethoxy tantalum (Ta-($OC_2H_5H$)$_5$), or tantalum chloride can be employed as a source of the tantalum for the $Ta_2O_5$ thin film. Also, an oxygen gas is introduced from the side of the ECR plasma generating chamber 19 and the tantalum source is introduced from the side of the reaction chamber 19 of the apparatus, when forming the $Ta_2O_5$ thin film.

By employing the ECR plasma CVD method, an extremely active oxygen radical can be effectively generated, and thus the thus obtained $Ta_2O_5$ thin film has few oxygen vacancies, and accordingly, the leakage current is reduced.

As mentioned above, the temperature of the substrate at the time of forming the film is 400° to 840° C. Therefore, if the temperature of the substrate is less than 400° C., the obtained film has a poor fineness and a large leakage current occurs. If the temperature of the substrate is more than 850° C., the surface flatness (morphology) of the obtained film becomes very rough, and the leakage current between the upper electrode and the lower electrode is rapidly increased.

Next, the present invention will be explained in further detail with reference to examples, although the invention is not limited to these examples.

EXAMPLE

Example 1

Figure 2:
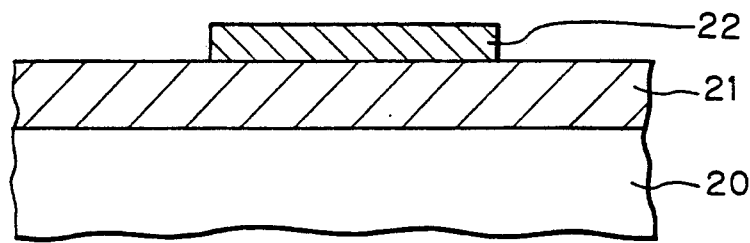
FIG. 2 is a sectional view showing one example of the present invention.

FIG. 1 is an explanatory view showing the construction of the ECR plasma CVD apparatus used for carrying out one example of the present invention, and FIG. 2 is a sectional view of a structure for explanation of the steps in the process according to one embodiment of the present invention.

In FIG. 2, numeral 20 denotes a Si substrate, 21 denotes a $Ta_2O_5$ thin film, and 22 denotes a tungsten film.

A Metal Oxide Semiconductor (MOS) containing a $Ta_2O_5$ film as an insulating material, as shown in FIG. 2, was fabricated by means of the ECR plasma CVD apparatus shown in FIG. 1.

First, before forming the $Ta_2O_5$ thin film, the Si substrate 7 (FIG. 1) was heated to a temperature of 600° C. by a heater 8, to remove the natural oxide surface layer on the p-type Si substrate 7 having a 10 Ωcm value.

Next, hydrogen ($H_2$) was introduced to the apparatus, and the chamber 19 was depressurized to $5 \times 10^{-3}$ Torr.

Next, microwaves were introduced, at a output power of 500W, into the chamber 19 through a window 4 made of alumina, via a waveguide 2 from a microwave generator 1, and the ECR plasma thereby generated was radiated onto the Si substrate 7 in the reaction chamber 19.

Next, an oxygen ($O_2$) gas was introduced at a flow ratio of 100 sccm, to effectively generate an active oxygen radical, into the ECR plasma chamber 18.

Also, a hydrogen ($H_2$) carrier gas was introduced at a ratio of 100 sccm to a bubbler in which $Ta(OC_2H_5)_5$ was placed as a tantalum source, and thereby $Ta_2O_5$ was introduced into the reaction room 19 at a bubbling temperature of 120° C.

Next, the ECR plasma, generated by using the microwaves of 2.45 GHz and an output power of 500 W, was radiated onto the Si substrate 7 in the chamber 19 kept at a vacuum of $5 \times 10^{-3}$ Torr, to form a $Ta_2O_5$ thin film on the Si substrate 7, the latter heated to 600° C., to a thickness of 1000 Å.

Note, the pressure of the chamber 19 is usually kept at $1 \times 10^{-2}$ to $1 \times 10^{-3}$ Torr, to control the formation of the thin film. Also, the hydrogen flow rate is usually 20 to 500 sccm.

Finally, a tungsten (W) film 22 (FIG. 2) was formed to a thickness of 4,000 Å, followed by patterning, to thereby obtain an electrode.

Figure 3:
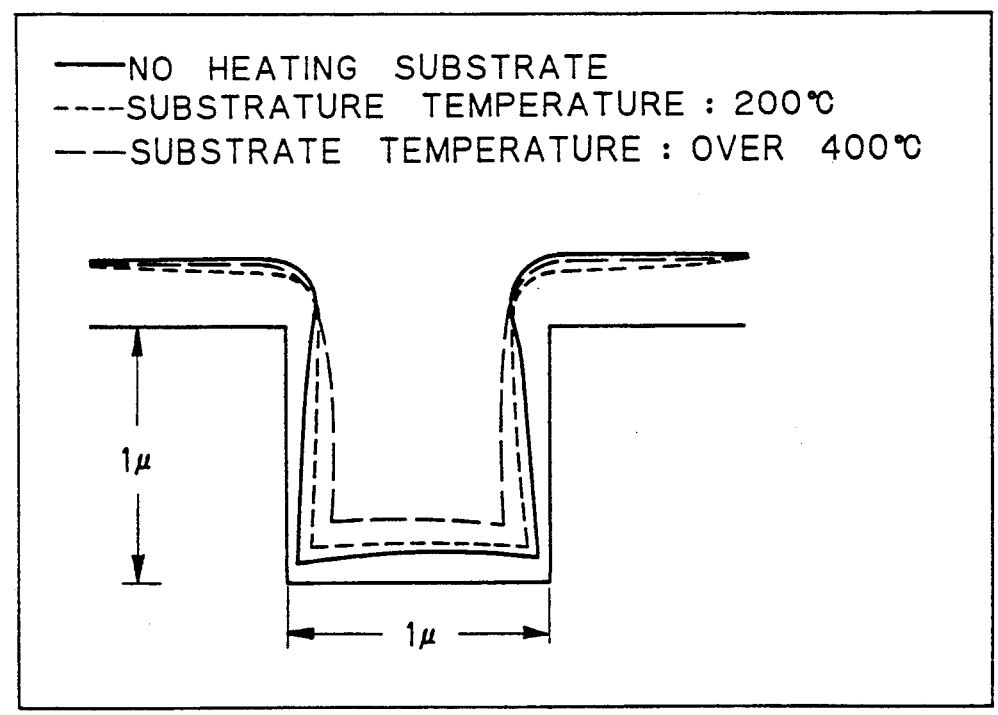
FIG. 3 is a graph showing the step coverages obtained by the present process and the prior process.
Figure 4:
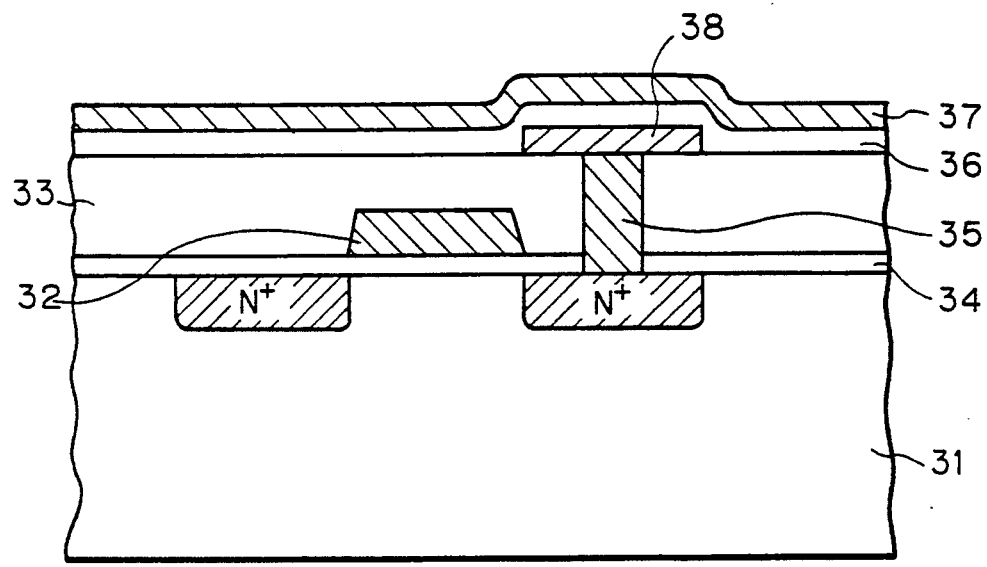
FIG. 4 is a sectional view showing a memory cell consisting of one transistor and one capacitor, as one example of a device made by the process of the present invention.

FIG. 3 is a graph showing the step coverage obtained by the present process and the prior process. The sample was obtained by the following procedures: The oxide layer was formed on the whole surface of a Si substrate to a thickness of 3000 Å, followed by growing a poly Si layer to a thickness of 1μ. Next, an opening of 1μ × 1μ was formed in the substrate, and then the tantalum film was coated on the whole surface to a thickness of 1000 Å by ECR plasma CVD.

As shown in FIG. 3, when forming the tantalum oxide at a substrate temperature of over 400° C., a good step coverage profile was obtained, but when forming the tantalum oxide at a substrate temperature of 200° C. or without heating, a bad step coverage profile was obtained.

Example 2

This example explains the production of a memory cell consisting of one transistor and one capacitor.

A p-type Si substrate 31 was oxidized to form an oxide layer 34 to a thickness of 200 Å, and then a poly Si layer 34 was formed on the oxide layer to a thickness of 4000 Å and patterned to form a word line 32, and an ion-implantation step was carried out to form an $n^+$-type layer, and thereafter, a PSG layer 33 was formed to a thickness of 1 μm.

A part of the PSG layer 33 was removed to form an opening, and tungsten 35 was deposited in the opening. Thereafter, a Pt layer was formed to a thickness of 1000 Å on the whole surface of the substrate, and the Pt layer then was patterned to form a lower electrode 38.

The tantalum oxide ($Ta_2O_5$) layer 36 was formed on the whole surface of the substrate to a thickness of 1000 Å and then a Pt layer was formed on the whole surface of the tantalum oxide layer 36 to form an upper electrode 37, whereby the memory cell was completed.

Figure 5:
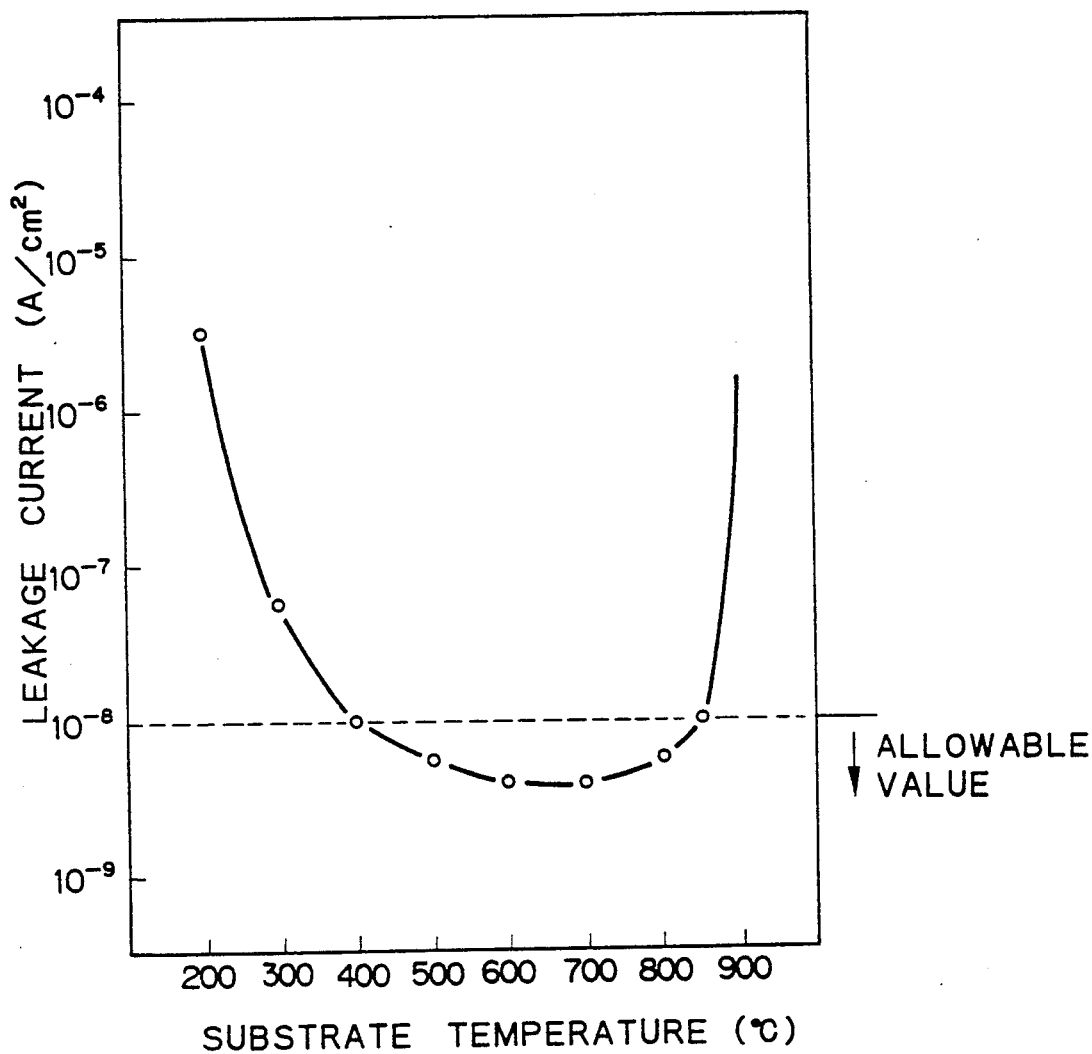
FIG. 5 is a graph showing the relationship between the leakage current and the temperature of the substrate; and, FIG. 6 is a graph showing the relationship between the roughness of the surface and the substrate temperature.

For the obtained memory cell, the leakage current was measured under the condition of an electric field of 3 MV/cm, while changing the substrate temperature during the $Ta_2O_5$ formation from 200° C. to 900° C. FIG. 5 shows the result of the measurement. As shown in FIG. 5, when the temperature of the substrate ranges from 400° C. to 850° C., the leakage current can be decreased to less than $10^{-8}$ A/cm² (allowable value).

The leakage current for a tantalum oxide layer prepared by the prior art (MOCVD method) was measured under the condition of an electric field of 3 MV/cm, to obtain data of more than $1 \times 10^{-6}$ A/cm².

The surface roughness of the obtained tantalum oxide layer (100 nm) during the above step, using the ECR plasma CVD method while changing the temperature of the substrate, was measured by Atomic Force Microscopy.

Figure 6:
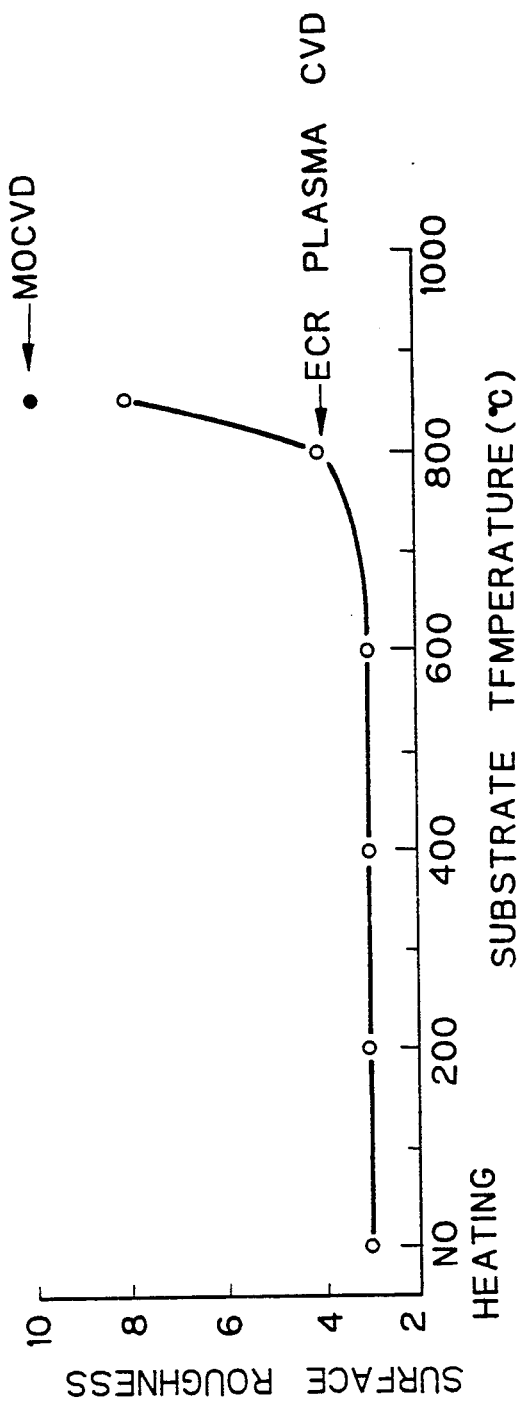

FIG. 6 shows the data of the surface roughness of the tantalum oxide layer. The black mark shows the data obtained by the prior art (MOCVD method). As shown in FIG. 6, the surface roughness of the obtained tantalum oxide layer of the present invention is very small.

As described above, the obtained tantalum oxide thin film in accordance with the present invention has little leakage current, provides good coverage, and has good surface flatness. Therefore, this tantalum oxide can be employed as a high dielectric condenser film in a semiconductor element.

We claim:

1. A process for the preparation of a high dielectric thin film, which comprises forming a tantalum oxide film on a substrate at a temperature of from 400° to 850° C. by means of an electron cyclotron resonance plasma chemical vapor deposition (ECR plasma CVD) method, wherein the tantalum oxide film is a $Ta_2O_5$ film, and the tantalum source for the tantalum oxide film is selected from the group consisting of ethoxy tantalum ($Ta(OC_2H_5)_5$) and tantalum chloride.

2. A process according to claim 1 employing an ECR plasma CVD apparatus having an ECR plasma generating chamber and a reaction chamber in communication with the ECR plasma generating chamber, wherein oxygen gas is introduced into the ECR plasma generating chamber and the tantalum source is introduced into the reaction chamber.

3. A process according to claim 1, wherein the pressure in the ECR generating chamber is maintained in the range of $1 \times 10^{-2}$ Torr to $1 \times 10^{-3}$ Torr, to control the composition of the tantalum oxide film.

* * * * *

UNITED STATES PATENT AND TRADEMARK OFFICE
CERTIFICATE OF CORRECTION

PATENT NO. : 5,312,783
DATED : May 17, 1994
INVENTOR(S) : TAKASAKI et al.

It is certified that error appears in the above-indentified patent and that said Letters Patent is hereby corrected as shown below:

Col. 2, line 68, change "19" to --18--.

Col. 4, line 25, delete "34" and after "oxide layer" insert --34--.

Signed and Sealed this

Fourth Day of October, 1994

Attest:

BRUCE LEHMAN

Attesting Officer     Commissioner of Patents and Trademarks